(12) United States Patent
Volkerink et al.

(10) Patent No.: US 7,131,046 B2
(45) Date of Patent: Oct. 31, 2006

(54) SYSTEM AND METHOD FOR TESTING CIRCUITRY USING AN EXTERNALLY GENERATED SIGNATURE

(75) Inventors: Erik H. Volkerink, San Jose, CA (US); Ajay Khoche, Cupertino, CA (US); Klaus D. Hilliges, Mountain View, CA (US)

(73) Assignee: Verigy IPco, Singapore (SG)

( * ) Notice: Subject to any disclaimer, the term of this patent is extended or adjusted under 35 U.S.C. 154(b) by 442 days.

(21) Appl. No.: 10/308,323

(22) Filed: Dec. 3, 2002

(65) Prior Publication Data

US 2004/0107395 A1 Jun. 3, 2004

(51) Int. Cl.
*G16R 31/28* (2006.01)

(52) U.S. Cl. ...................................... 714/732
(58) Field of Classification Search ............. 714/732, 714/735, 736, 724, 718, 719
See application file for complete search history.

(56) References Cited

U.S. PATENT DOCUMENTS

| | | | |
|---|---|---|---|
| 4,503,537 A | 3/1985 | McAnney | |
| 4,513,418 A | 4/1985 | Bardell, Jr. et al. | |
| 5,051,996 A | 9/1991 | Bergeson et al. | |
| 5,206,582 A | 4/1993 | Ekstedt et al. | |
| 5,313,469 A | 5/1994 | Adham et al. | |
| 5,369,648 A | 11/1994 | Nelson | |
| 5,416,783 A | 5/1995 | Broseghini et al. | |
| 5,583,786 A | 12/1996 | Needham | |
| 5,633,877 A | 5/1997 | Shephard, III et al. | |
| 5,642,362 A | 6/1997 | Savir | |
| 5,668,817 A | 9/1997 | Adham | |
| 5,694,401 A * | 12/1997 | Gibson ................... | 714/728 |
| 5,938,784 A | 8/1999 | Kim | |
| 5,954,830 A | 9/1999 | Ternullo, Jr. | |
| 5,960,008 A | 9/1999 | Osawa et al. | |
| 5,968,194 A * | 10/1999 | Wu et al. ............... | 714/726 |
| 5,978,946 A | 11/1999 | Needham | |
| 6,001,662 A | 12/1999 | Correale, Jr. et al. | |
| 6,158,033 A | 12/2000 | Wagner et al. | |
| 6,199,184 B1 | 3/2001 | Sim | |
| 6,240,537 B1 | 5/2001 | Sim | |
| 6,327,685 B1 | 12/2001 | Koprowski et al. | |
| 6,363,506 B1 | 3/2002 | Karri et al. | |
| 6,374,370 B1 | 4/2002 | Bockhaus et al. | |
| 6,393,594 B1 | 5/2002 | Anderson et al. | |

(Continued)

OTHER PUBLICATIONS

Abramovici, Miron et al., "Digital Systems Testing and Testable Design," IEEE Press, 1990, pp. 432-449.

(Continued)

*Primary Examiner*—James C. Kerveros

(57) ABSTRACT

A system and method that enables testing of circuitry using an externally generated signature. An external tester is arranged external to a device under test (DUT). Such external tester is operable to input test data to the DUT, receive output data from the DUT, and generate a signature for at least a portion of such received output data. The external tester compares the generated signature with an expected signature to determine whether the DUT is functioning as expected. If the generated signature fails to match an expected signature, then error data can be written to an error map log. Preferably, further interaction with the DUT is not required after detecting that a generated signature fails to match an expected signature in order to perform such error evaluation. Thus, error evaluation can be performed concurrently with testing of the DUT. Mask data may be stored in a compressed form, and decompressed and used for masking certain non-deterministic output bits in generating the signature.

27 Claims, 6 Drawing Sheets

U.S. PATENT DOCUMENTS

| | | |
|---|---|---|
| 6,442,722 B1 | 8/2002 | Nadeau-Dostie et al. |
| 6,452,411 B1 * | 9/2002 | Miller et al. ................. 324/765 |
| 6,460,152 B1 * | 10/2002 | Demidov et al. ........... 714/723 |
| 6,684,358 B1 * | 1/2004 | Rajski et al. ............... 714/739 |
| 2002/0073374 A1 | 6/2002 | Danialy et al. |

OTHER PUBLICATIONS

Bassett, Robert W. et al., "Low-Cost Testing of High-Desnity Logic Components," IEEE Press, 1990, pp. 15-28.
U.S. Appl. No. 09/802,440, filed Mar. 9, 2001, Khoche et al.
U.S. Appl. No. 10/155,651, filed May 24, 2002, Volkerink et al.

* cited by examiner

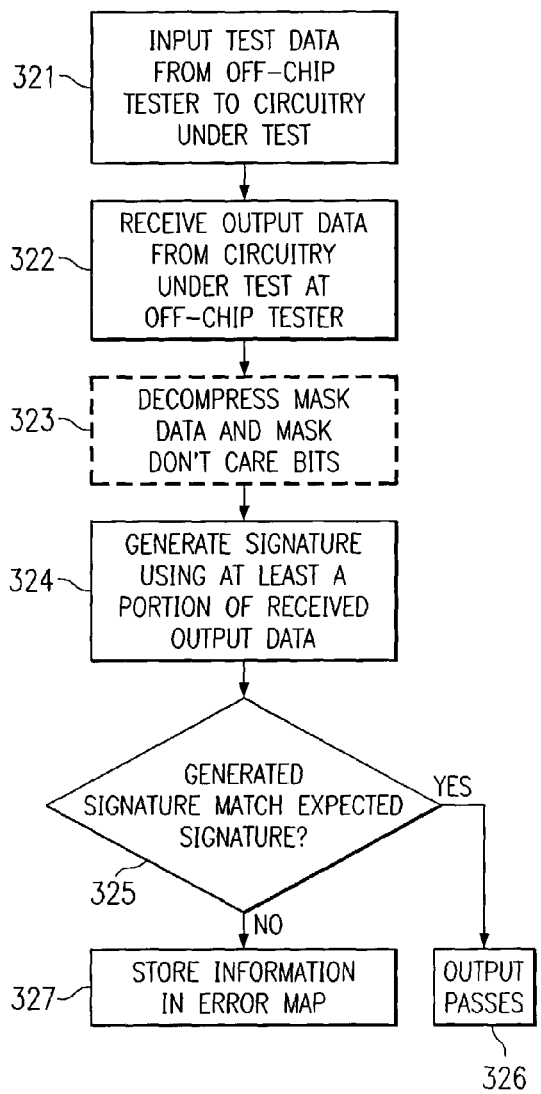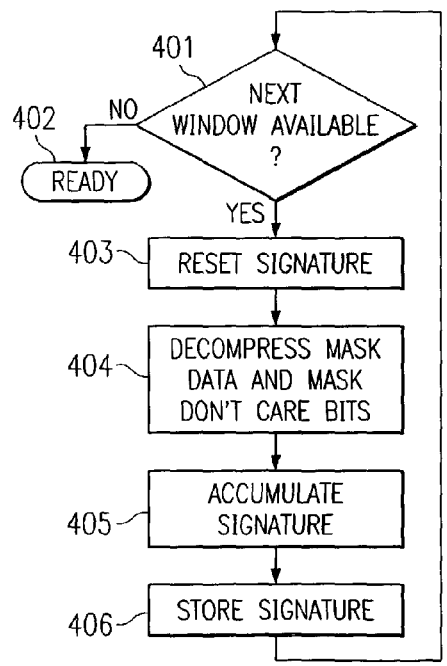

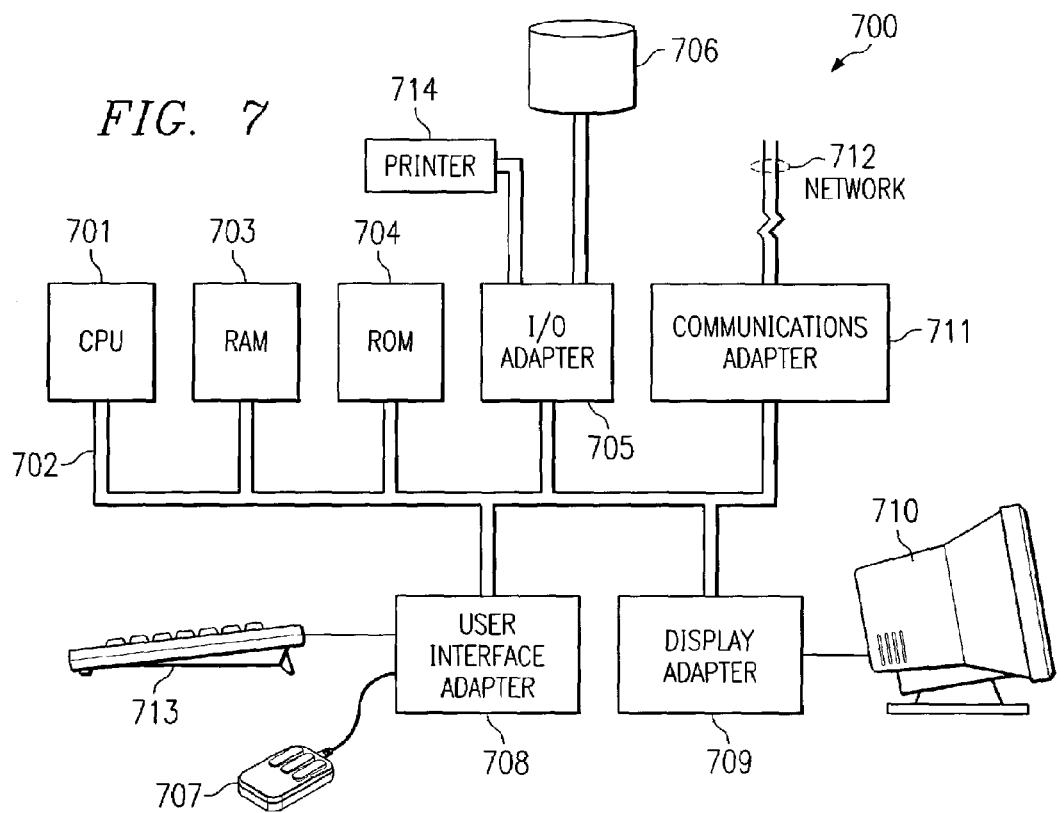
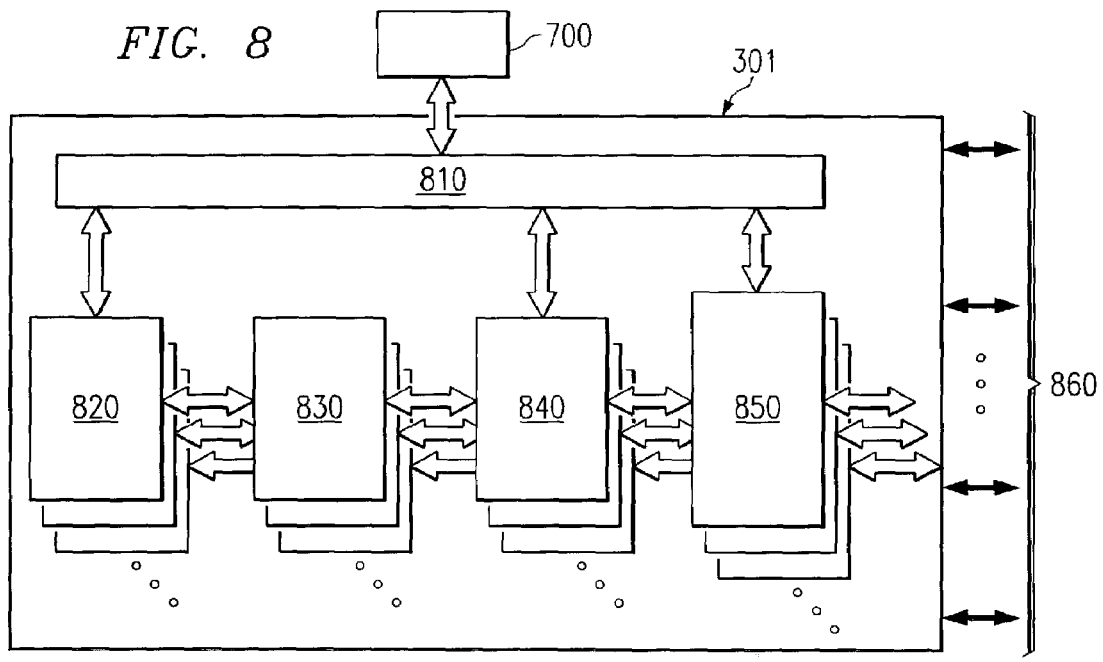

SYSTEM AND METHOD FOR TESTING CIRCUITRY USING AN EXTERNALLY GENERATED SIGNATURE

TECHNICAL FIELD

The present invention relates in general to testing of integrated circuits, and more particularly to a system and method for testing of circuitry utilizing a signature generated external to the circuitry under test.

BACKGROUND OF THE INVENTION

During typical semiconductor manufacturing processes, a plurality of integrated circuits are formed as individual dice on a semiconductor wafer. Each semiconductor wafer generally has hundreds to thousands of individual dice formed thereon. Once the dice are formed on a semiconductor wafer, the dice are then tested to determine which dice are functional and which dice are not functional. In most testing procedures, each die is probed using probe equipment while the dice are still on the wafer. This step is also known as "wafer sort."

The purpose of the wafer-level probe test is to determine, as early as possible in the manufacturing process, whether each individual die is defective or not. The earlier a defective die is detected, the less time and expense that is wasted on further processing of defective dice. That is, if it is determined that a detected defect cannot be repaired, the time and expense of completing a chip assembly will not be expended. After the wafer-level testing, the functional dice are then packaged, and generally the packaged part is tested again to ensure that no defects were introduced during packaging. Various techniques have been developed for performing wafer-level testing, such as those described further below, and as is known in the art similar techniques may also be used for testing a packaged device.

In typical semiconductor testing, the device under test (DUT) (which may be referred to as "circuitry under test" (CUT) and is intended to encompass a device under test on a wafer as well as a packaged device) receives a set of input stimuli from automatic test equipment (ATE) arranged external to the DUT, after which the ATE observes the DUT outputs. In general, the correct expected outputs of the DUT are stored in the ATE memory, and the ATE compares all of the output bits received from the DUT against the stored expected bit values to determine whether the DUT is functioning properly (e.g., whether the DUT is generating the expected output values responsive to the input values). Thus, a DUT (e.g., a device on a wafer or a packaged device) may be communicatively coupled to an external ATE, and such ATE may input test stimuli thereto and receive and analyze responses therefrom. As described further below, circuitry may be included on the DUT, which may, for example, generate a signature corresponding to the DUT's response to the input stimuli, and such signature may be output to the ATE. While much of the testing techniques described herein are described as testing a DUT that is on a wafer (i.e., wafer-level testing), it should be recognized that similar techniques may typically also be used for testing a packaged device.

In the case of wafer-level testing, a probe may be brought into contact with one or more bonding pads of a die in order to communicate signals (e.g., a test pattern) to the die and to receive the signals output by the die responsive to the input signals. The probe is typically communicatively coupled to an external ATE that is operable to generate the signals to be input to a die and to evaluate the signals output by the die in order to determine whether the die is functioning properly. Dice on a wafer may be tested serially (e.g., by contacting each die with the probe in series) or in parallel.

Traditional testing techniques of the existing art require an undesirably large amount of memory on the ATE utilized for the testing, which undesirably increases the cost of the ATE and the resulting product. For instance, sufficient data storage that is communicatively coupled to the ATE is generally required for storage of at least the following information for a testing technique: 1) input vector data, 2) output vector data, and 3) mask vector data. In general, the input vector data stored at the ATE comprises the data that is used as stimuli for inputs to the DUT (e.g., test pattern data), and the output vector data comprises the expected output data of the DUT given the input vector data, which is used for comparison with the actual output data of the DUT responsive to the input vector data to determine whether the DUT is functioning properly. Generally, the mask vector data comprises data designating which of the bits of the expected output data actually need to be compared to the received outputs of the DUT, e.g., the mask vector data maps the expected output data to the actual output data received from the DUT, as in certain configurations all of the output bits of the DUT may not be compared with expected output data (e.g., certain non-deterministic bits, or "don't care/unknown bits", may exist, the value of which is not relevant to the correct functioning of the DUT).

Such input vector data, output vector data, and mask vector data for a testing technique may consume an undesirably large amount of data storage space on the ATE. Further, as the comprehensiveness of a testing technique is increased and/or as the complexity of the device to be tested increases, the amount of data storage space consumed on the ATE for this vector data is likely also increased. For example, traditional testing techniques of the existing art commonly use approximately 400 to 800 bits per gate of the DUT being tested. Of course, depending on the complexity of the DUT and/or the comprehensiveness of the testing technique implemented (e.g., the number of flip-flops on the DUT being tested and/or the number of input test patterns utilized), the size of the input vector data, output vector data, and/or mask vector data may vary from testing technique to testing technique (but, in current ATE architectures, for each output bit a mask bit is required such that mask vector memory is equal to the output vector memory). Embodiments of the present invention breaks this barrier, thus enabling reduction in the amount of data storage required on an ATE for a test.

In general, it is desirable to minimize the amount of data storage required on the ATE for implementing a testing technique. Several solutions have been proposed in the existing art for reducing the ATE's data storage requirements for implementing a testing technique, and more particularly, for reducing the ATE's storage requirements for storing the output vector data for a testing technique. The most pervasive techniques for minimizing the amount of data storage required on an ATE for storing output vector data are vector set truncation techniques and on-chip signature analysis techniques, which are described further below.

One popular technique for minimizing the amount of data storage required on an ATE for storing output vector data is truncation. In general, truncation involves dropping a portion of the test, i.e., a portion of the output data, mask data, and/or input data (i.e., not using this test portion in determining whether the DUT is functioning properly). As a result, the amount of data stored on the ATE may be reduced.

However, truncation of vector sets (e.g., input, output, and mask vector sets), for example, also results in a reduction of test coverage, and as a consequence, may result in reduction of product quality (i.e., truncation reduces the comprehensiveness of the testing of a DUT, which may result in an improperly functioning DUT passing the test). This reduction in product quality is often not acceptable. Sometimes this technique is used in combination with vector set reordering based on the likelihood of a vector actually detecting a defect for each vector, after which the tail of the vector data is truncated. This way, the impact on test coverage can be minimized. However, in most cases there is still a significant impact on the test coverage.

One of the most attractive output compression schemes is based on signature analysis. Signature analysis is a well-known technique for compressing a sequence of logic values output from a circuit under test into a relatively small number of bits of data (signature) that, when compared to stored data (e.g., an expected signature), will indicate the presence or absence of faults in the circuit. In general, a signature of a group of output bits compresses such group of output bits and uniquely identifies such group of output bits such that it may be determined whether the group of output bits are as expected. It should be noted that there is generally a slight possibility of obtaining a correct signature for incorrect output bits (aliasing). While a signature may be used to discern whether the group of output bits is as expected, if the signature is not as expected it generally cannot be discerned from the signature which one(s) of the group of output bits had unexpected values. Thus, diagnosis of errors or error debug is generally limited (e.g., unavailable) when on-chip signature generation is used. In general, error diagnosis refers to a process for identifying an error in a DUT, such as determining the situation(s) under which the DUT has an error and/or determining the bit(s) that are incorrect as a result of the error. Error debug generally refers to a process for determining the cause of an error.

Various techniques for generating a signature for output data are well known in the art. For example, one technique comprises feeding the complete output vector data through a linear feedback shift register with different exclusive OR (XOR) feedback loops, which results in a very short signature in the shift register that depends on all output vector data. When the feedback loops, i.e. the polynomials, of the shift register are selected carefully, no significant aliasing will occur. On-chip techniques for generating a signature of the chip's output data during testing have been proposed in the existing art using circuitry called a SISR (Single Input Signature Register) or (in the case of multiple XORed inputs) a MISR (Multiple Input Signature Register). Such SISR and MISR circuitry for generating signatures on-chip are well-known in the art, and therefore are not described in greater detail herein. Examples of test schemes that use signature analysis (e.g., via a MISR) are described in the following patents: 1) U.S. Pat. No. 6,442,722 entitled "METHOD AND APPARATUS FOR TESTING CIRCUITS WITH MULTIPLE CLOCKS", issued to Nadeau-Dostie et al.; 2) U.S. Pat. No. 6,393,594 entitled "METHOD AND SYSTEM FOR PERFORMING PSEUDO-RANDOM TESTING OF AN INTEGRATED CIRCUIT", issued to Anderson et al.; 3) U.S. Pat. No. 6,374,370 entitled "METHOD AND SYSTEM FOR FLEXIBLE CONTROL OF BIST REGISTERS BASED UPON ON-CHIP EVENTS", issued to Bockhaus et al.; 4) U.S. Pat. No. 6,363,506 entitled "METHOD FOR SELF-TESTING INTEGRATED CIRCUITS", issued to Karri et al.; 5) U.S. Pat. No. 6,327,685 entitled "LOGIC BUILT-IN SELF TEST", issued to Koprowski et al.; 6) U.S. Pat. No. 6,240,537 entitled "SIGNATURE COMPRESSION CIRCUIT AND METHOD", issued to Sim; 7) U.S. Pat. No. 6,158,033 entitled "MULTIPLE INPUT SIGNATURE TESTING & DIAGNOSIS FOR EMBEDDED BLOCKS IN INTEGRATED CIRCUITS", issued to Wagner et al.; 8) 5,978,946 entitled "METHODS AND APPARATUS FOR SYSTEM TESTING OF PROCESSORS AND COMPUTERS USING SIGNATURE ANALYSIS", issued to Needham; 9) U.S. Pat. No. 5,960,008 entitled "TEST CIRCUIT", issued to Osawa et al.; and 10) U.S. Pat. No. 5,938,784 entitled "LINEAR FEEDBACK SHIFT REGISTER, MULTIPLE INPUT SIGNATURE REGISTER, AND BUILT-IN SELF TEST CIRCUIT USING SUCH REGISTERS", issued to Kim, the disclosures of which are hereby incorporated herein by reference. A further example of a test scheme that uses signature analysis (e.g., via a MISR) is described in U.S. Published patent application No. 20,020,073,374 entitled "METHOD, SYSTEM AND PROGRAM PRODUCT FOR TESTING AND/OR DIAGNOSING CIRCUITS USING EMBEDDED TEST CONTROLLER ACCESS DATA", the disclosure of which is hereby incorporated herein by reference.

It should be recognized that because a signature is a compressed identification of the output bits, the amount of storage space required on an ATE for storing the output vector data (expected signatures) may be reduced well below that required for storing all of the actual expected output bits. Further, because a signature may identify an entire set of output bits (within the bounds of aliasing) desired to be analyzed (e.g., the entire output vector), test coverage is not reduced, as in the case of truncation.

However, on-chip signature analysis techniques of the existing art have several disadvantages. First, such techniques include circuitry on-chip for generating a signature of the chip's output data during testing. Such signature generation circuitry consumes area on the chip, thus increasing the overall size of the chip (or decreasing the amount of circuitry that may otherwise be included in the chip) and potentially hindering the chip's performance (e.g., because of the increased distance that signals may be required to travel given the increased size of the chip). Also, implementing the signature generation circuitry on-chip may require design modifications to be made to the circuitry under test in order to enable such signature generation circuitry to be implemented therewith. Further, the signature generation circuitry is typically utilized only during testing of the circuitry. That is, the signature generation circuitry is typically not utilized during normal operation of the circuitry in the target application. Thus, implementing the signature generation circuitry on-chip is disadvantageous in that it consumes area on the chip (thus increasing the overall size of the chip) and is useful only during-testing of the chip. Further, as mentioned above, on-chip signature generation is generally disadvantageous because it does not allow for error diagnosis (i.e., a determination as to which one(s) of a group of output bits that have incorrect outputs cannot be made from the signature of such output bits) or error debug. Further still, on-chip signature generation circuitry may itself have defects.

Additionally, since the signature depends on all output vector data, it also depends on the output vector data bits that have a non-deterministic behavior. This non-deterministic behavior can, for example, occur when a partial scan approach is used, e.g., only a subset of flip-flops on a DUT is scanned. In certain designs, some flip-flops cannot be scanned due to design constraints. Other sources of non-deterministic (unknown) output states include having multiple clock domains and tri-state buses. As a consequence, the values of these non-deterministic bits cannot be controlled without additional design modifications. However, these design modifications result in area overhead and potential performance degradation. The presence of unknown/non-deterministic output signals can corrupt the signature, making the signature and the test almost always useless. The design modifications impact on area, flow, and design performance can be a substantial disadvantage, and not acceptable for some designs.

In addition, in the on-chip signature generation techniques that do not provide on-chip masking capability, the user sometimes desires to perform only a part of the test or suppress certain non-deterministic outputs from the circuitry under test, e.g., during the debugging phase or when certain expected outputs turn out to be simulated incorrectly. In that case, depending on the number of masked outputs, signature analysis techniques of the existing art cannot be used. That is, because the signature generation techniques of the existing art comprise on-chip circuitry that is fixed for generating a signature for a certain set of output values, none of such output values can be masked out during the testing process. One could provide on-chip masking capability, however, in general extra channels/bandwidth are required to supply the masking data.

Moreover, it is very computationally intensive, and sometimes impossible, to reverse the signature analysis process. In other words, by using signature analysis techniques of the existing art, it is possible to determine a discrepancy between the actual output vector data and the expected output vector data. However, it is typically not possible to determine which received bits of the output vector data are wrong. This seriously limits the error diagnosis/debugging capability of signature-based testing methodologies of the existing art and typically requires a bypass mode for performing error diagnosis/debugging, which adds more circuitry and more inputs/outputs.

Proposals have been made for a tester that generates a signature off-chip. For example, "Low-Cost Testing of High-Density Logic Components", *IEEE Design & Test of Computers*, 0740–7475 (April, 1990) proposes a tester that includes signature generation logic that receives output from a DUT and generates a signature for such received output. However, such proposed tester has several shortcomings. For instance, the proposed tester does not allow for concurrent testing and error diagnosis/debugging. Further, the proposed tester does not allow for masking out of unknown states (e.g., masking of non-deterministic output bits) in generating a signature. We are aware of no commercially available ATEs that implement the technique proposed by the "Low-Cost Testing of High-Density Logic Components" article. Further, if an ATE were implemented in accordance with such proposal, it would not allow for masking of unknown states, and if such masking were implemented it would require a substantial amount of mask data stored at the ATE (as no compression of the mask data is proposed).

Because of the above-described disadvantages, the use of signature analysis techniques to reduce the ATE memory requirements is not wide spread.

BRIEF SUMMARY OF THE INVENTION

In view of the above, a desire exists for a system and method for testing circuitry that preferably conserves data storage requirements (e.g., ATE storage requirements) for implementing such testing technique. Further, a desire exists for a system and method that enables testing of circuitry that preferably minimizes the amount of on-chip circuitry required for implementing such testing technique. Further still, a desire exists for a system and method that enables testing of circuitry in a manner that allows for diagnosis/debug of detected errors to, for example, determine the specific output bit(s) from a device under test that are incorrect without requiring huge vector memory. Further, concurrent error diagnosis/debug and testing of the circuitry is desired. That is, a desire exists for concurrent error evaluation (e.g., diagnosis and/or debug) and testing of the circuitry. The term "error evaluation" is used broadly herein and is intended to encompass error diagnosis and error debug. Error evaluation further encompasses yield learning. That is, either error diagnosis, error debug, or yield learning may be considered an error evaluation. Additionally, a desire exists for such a system and method that further allow for masking of unknown states (e.g., non-deterministic bits) in generating a signature. A desire exists for a system and method that compresses at least the output data and mask data that are used for implementing a testing technique for testing of circuitry.

The present invention is directed to a system and method which enable testing of circuitry using an externally generated signature. In a preferred embodiment, an external tester is provided that is arranged external to a device under test (DUT). Such external tester is operable to input test data to the DUT, receive output data from the DUT, and generate a signature for at least a portion of such received output data. As described further herein, various advantages are recognized by generating a signature for output data external to the DUT. The external tester may then compare the generated signature with an expected signature to determine whether the DUT is functioning as expected. If the generated signature fails to match an expected signature, then error data may be written to an error map log. For instance, if the generated signature fails to match an expected signature, then at least a portion of the actual received output data (for which the generated signature was generated) may be written to an error map log. In a preferred embodiment, further interaction with the DUT is, depending on the error evaluation goals, not required after detecting an error (e.g., after detecting that a generated signature fails to match an expected signature) in order to perform such error evaluation (e.g., storing the actual received output data corresponding to an error to an error map log). Thus, error evaluation (e.g., diagnosis and/or debugging) may be performed concurrently with testing of the DUT. Accordingly, in a preferred embodiment, error evaluation may be performed concurrently with testing of a DUT to the extent supported by conventional ATEs. Thus, separate testing and debug modes are not required. That is, once testing is performed on the DUT, further interaction with the DUT is not required to perform error evaluation.

Further, a preferred embodiment of the present invention may be implemented in combination with mask vector compression and/or input vector compression techniques for a test for further conservation of data storage required for implementing the test. For instance, not only may a signature analysis be implemented for compressing the output vector data, but also input vector and/or mask vector compression techniques may also be implemented in combination therewith for minimizing the amount of data storage required at the ATE for implementing a given test.

In certain embodiments, the received output data is divided into a plurality of windows, wherein each window is a predetermined number of bits. The external tester generates a signature for each window, and compares the generated signature for each window with an expected signature for such window. If an error is detected (i.e., a generated signature for a window fails to match the expected signature for such window), then information relating at least to the failed window may be written to an error map log. For instance, the actual received output data for a failed window may be written to an error map log.

According to one embodiment of the present invention, an off-chip test system comprises a means for inputting test data to a chip under test, and a means for receiving output data from the chip under test responsive to the input test data. The off-chip test system further comprises means for generating a signature for at least a portion of the received output data, and a means for comparing the generated signature with an expected signature. The off-chip test system further comprises a means for storing information, to an error map log if the generated signature fails to match with the expected signature.

According to another embodiment of the present invention, a system for testing circuitry comprises an automated test equipment external to the circuitry that is at least temporarily communicatively coupled to such circuitry. The automated test equipment comprises a communicative interface for inputting test data to the circuitry, a communicative interface for receiving output data from the circuitry responsive to the input test data, and logic operable to generate a signature for at least a portion of the received output data. The automated test equipment further comprises compare logic for comparing a generated signature with an expected signature, and logic for storing information to an error map log if a generated signature fails to match an expected signature.

According to another embodiment of the present invention, a method for testing circuitry comprises inputting test data to circuitry under test, and receiving, at an external test device, output data from the circuitry under test responsive to the input test data. The method further comprises generating, at the external test device, a signature for at least a portion of the received output data, and comparing the generated signature with an expected signature to determine whether the circuitry under test functions as expected. If the generated signature fails to match with the expected signature, information is stored to an error map log, wherein further interaction with the circuitry under test is not required after determining that the generated signature fails to match the expected signature for acquiring the information for storing such information to the error map log.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 3B shows an example operational flow of a test system of a preferred embodiment of the present invention;

FIG. 4 shows an example flow chart that illustrates how expected window signatures are created in a preferred embodiment of the present invention;

FIG. 7 shows an example computer system that may be used for generating expected signatures to be used by a tester; and FIG. 8 shows a block diagram of an exemplary tester which may be adapted to implement embodiments of the present invention.

DETAILED DESCRIPTION OF THE INVENTION

As described above, in typical semiconductor testing, the device under test (DUT) (or "circuitry under test" (CUT)) receives a set of input stimuli from automatic test equipment (ATE) arranged external to the DUT, after which the ATE observes the DUT outputs. In general, the correct expected outputs of the DUT are stored in the ATE memory, and the ATE compares all of the output bits received from the DUT against the stored expected bit values to determine whether the DUT is functioning properly (e.g., whether the DUT is generating the expected output values responsive to the input values).

In the case of wafer-level testing, a probe may be brought into contact with one or more bonding pads of a die in order to communicate signals (e.g., a test pattern) to the die and to receive the signals output by the die responsive to the input signals. The probe is typically communicatively coupled to an external ATE that is operable to generate the signals to be input to a die and to evaluate the signals output by the die in order to determine whether the die is functioning properly.

Figure 1A:
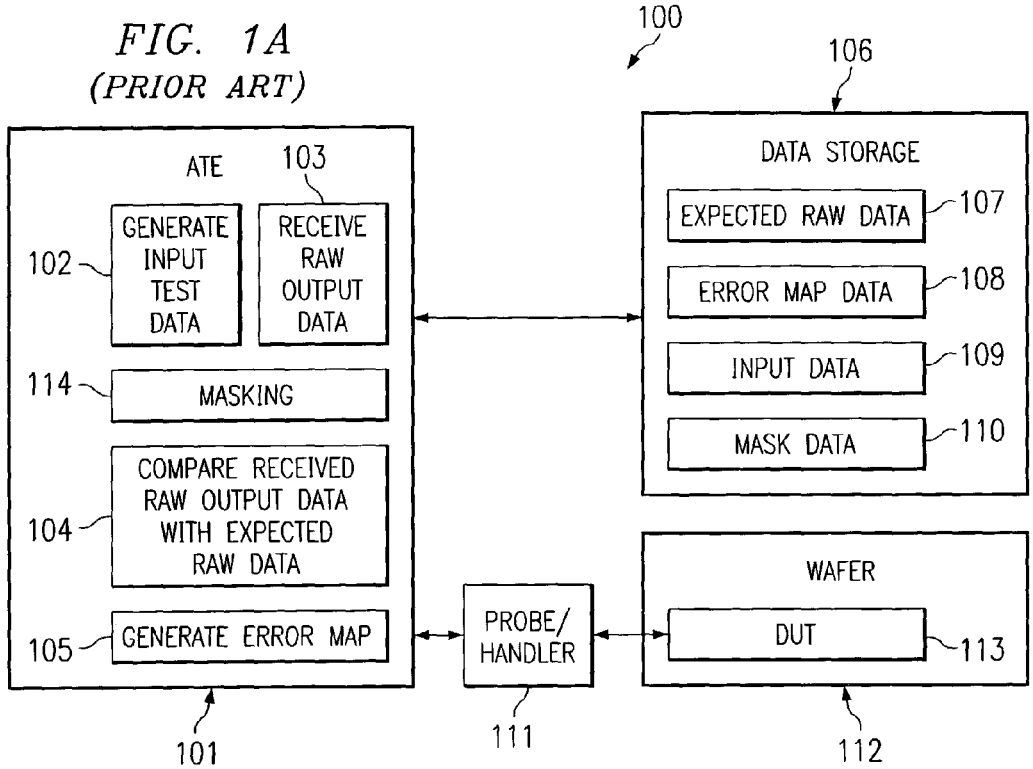
FIG. 1A shows a block diagram of a traditional testing system.
Figure 1B:
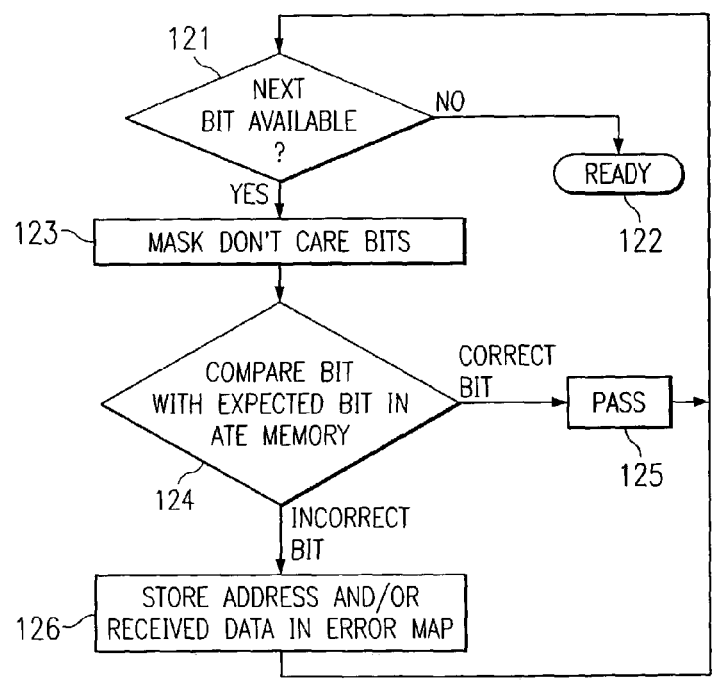
FIG. 1B shows an example operational flow of the traditional test system of FIG. 1A.

An example of this traditional approach is illustrated in FIGS. 1A–1B. FIG. 1A shows a block diagram of traditional testing system 100 that comprises ATE 101, which is communicatively coupled to probe 111. As described further below, probe 111 may be used to communicate input data to one or more DUTs, such as DUT 113 on wafer 112, and receive output data from such DUTs. As shown, data storage 106 is communicatively coupled to ATE 101 and stores information needed for performing the testing of DUT 113, such as input vector data 109, output vector data (or "expected raw data") 107, and mask vector data 110 for the test. Further, error map data 108 may be stored within data storage 106, as described further below. Data storage 106 is typically implemented as internal memory of ATE 101, but may, in certain implementations, be implemented as an external data storage medium that is communicatively coupled to ATE 101. As further shown, ATE 101 comprises logic 102 for generating input test data (e.g., input test pattern(s)) to be input to DUT 113, logic 103 for receiving raw output data from DUT 113 responsive to the input test data, logic 114 for masking non-deterministic bits of the received raw output data, logic 104 operable to compare the received, non-masked raw output data with expected raw data 107, and logic 105 for generating error map 108 for failed tests. Each of logic 102, 103, 114, 104, and 105 of ATE 101 may comprise software and/or hardware for performing their respective tasks.

In operation, probe 111 is typically brought into contact with the appropriate access pads for testing one or more DUTs, such as DUT 113. For instance, probe 111 is brought into contact with the appropriate pads for inputting test signals to DUT 113 and receiving output signals from DUT 113. Logic 102 of ATE 101 is then used to communicate input test data to DUT 113. For instance, such input test data may comprise a pattern of input signals designed to test the responsiveness of DUT 113 to various different input stimuli. Thereafter, logic 103 of ATE 101 receives the output data generated by DUT 113 responsive to the test input data. Logic 114 is used to mask the non-deterministic bits of the received raw output data, and logic 104 is used to compare the non-masked, raw output data received from DUT 113 to the expected raw data 107 stored in data storage 106. Thus, it is determined whether the output data generated by DUT 113 responsive to the input data is as expected. If it is determined that the output data received from DUT 113 is not as was expected responsive to the input data (i.e., the received non-masked, output data does not match the expected output data 107), then logic 105 may generate information in error map 108 about this failed test. Such error map information may comprise an error log of the expected output and actual output received, for example. This process may repeat for any number of input test patterns that are generated for testing DUT 113.

FIG. 1B shows an example operational flow of the traditional test system 100 of FIG. 1A. As shown, in operational block 121, it is determined whether a next output bit is available from DUT 113 responsive to particular input test data. That is, input test stimuli (e.g., a test pattern) is input to DUT 113 and it is determined whether all of the output bits from DUT 113 responsive to such input test stimuli are received at ATE 101. If no further output bits are expected from DUT 113, then it is determined at block 122 that the testing is complete. However, if it is determined that an output bit has been received from DUT 113 responsive to a given input test pattern, then operation advances in the ATE 101 to operational block 123 whereat a "don't care" bit (or "non-deterministic" bit) may be masked. For example, certain output bits may have a non-deterministic behavior (e.g., may not indicate whether DUT 113 is functioning properly responsive to the input pattern), and such bits whose value the test doesn't care about may be masked (or filtered) from the received output data. Thus, the received bit may be masked in operational block 123.

Thereafter, if the received output bit is not masked in block 123, then in operational block 124 the ATE 101 compares the received output bit with the expected output bit 107 to determine whether such output bit matches with the expected bit 107. If the received output bit matches the expected output bit 107, then it is determined that DUT 113 passes this test in block 125, and operation may return to block 121 to perform further testing (e.g., receive further output bits from DUT 113). However, if the received output bit does not match the expected output bit 107, then it is determined that DUT 113 fails this test and information about such failure (e.g., the address and/or received output data from DUT 113) may be stored to error map 108, which may be later used in debugging of DUT 113 to determine the reason that it failed this test.

In view of the above, traditional testing techniques generally store all of the expected output bits for various different input test patterns as the output vector data 107 in data storage 106 for ATE 101. Storing all of such expected output bits results in extremely high ATE memory requirements. Further, as technology progresses the required output vector data volume is expected to grow steeply with the scaling of semiconductor technology. Hence, in the future, the problem is expected to become even worse.

As a consequence, certain solutions have been proposed in the existing art for trying to reduce the ATE memory requirements for storing such output vector data. As mentioned above, one proposed solution truncates a portion of the output vector data simply because the ATE is unable to meet the high memory demands. As described above, such truncation results in a reduction of test coverage, which may result in lower product quality.

Another solution is to utilize signature analysis in order to compress the output data vector. As described above, signature analysis is a well-known technique for compressing a sequence of logic values output from a circuit under test into a relatively small number of bits of data (signature). Various techniques for generating a signature for output data are well known in the art. Typically, well-known SISR (Single Input Signature Register) or MISR (Multiple Input Signature Register) circuitry is implemented on-chip in order to generate a signature for the chip's output values responsive to an input test pattern. In certain implementations, well-known Cellular Automata circuitry may be implemented on-chip in order to generate a signature for the chip's output values responsive to an input test pattern. Because various implementations of Cellular Automata circuitry for generating a signature are well-known in the art, such Cellular Automata is not described further herein.

Figure 2:
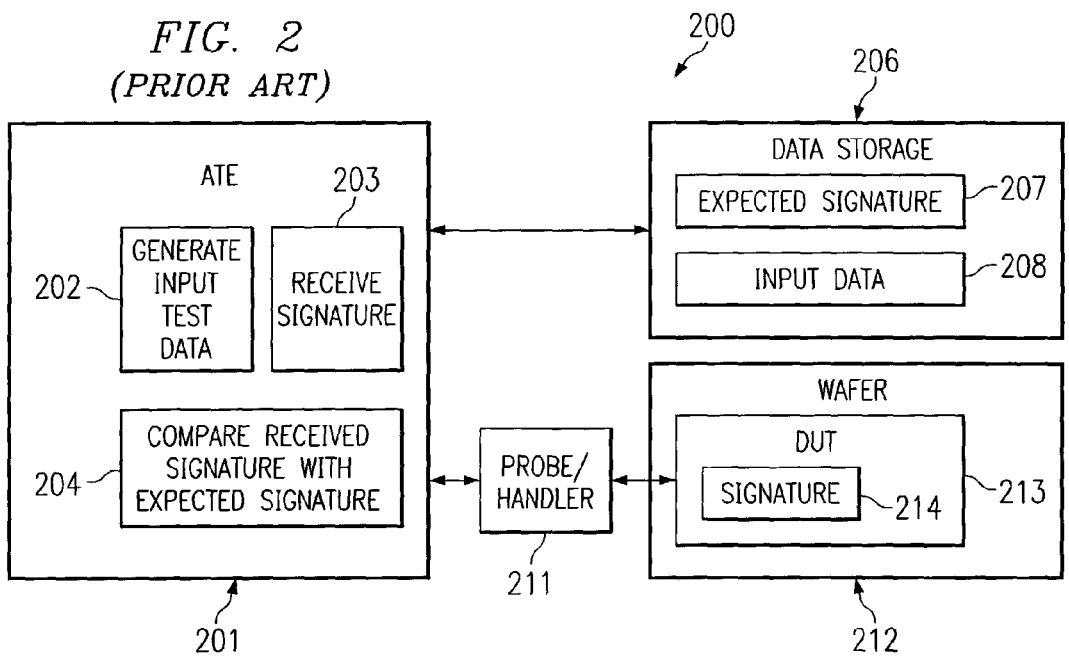
FIG. 2 shows an example block diagram of a prior art test system that utilizes signature analysis.

Turning to FIG. 2, an example block diagram of a prior art test system 200 that utilizes signature analysis is shown. Testing system 200 comprises ATE 201, which is communicatively coupled to probe 211. As described further below, probe 211 may be used to communicate input data to one or more DUTs, such as DUT 213 on wafer 212, and receive output data from such DUTs. In this test solution, signature generating circuitry 214 (e.g., a SISR, MISR, or Cellular Automata) is included within DUT 213, which is operable to generate a signature of output values that are generated by DUT 213 responsive to input test values. As shown, data storage 206 is communicatively coupled to ATE 201 and stores information needed for performing the testing of DUT 213, such as input vector data 208 and expected signatures 207. As further shown, ATE 201 comprises logic 202 for generating input test data to be input to DUT 213, logic 203 for receiving a signature (generated by circuitry 214) from DUT 213 responsive to the input test data, and logic 204 operable to compare the received signature with expected signature 207.

In operation, probe 211 is typically brought into contact with the appropriate access pads for testing one or more DUTs, such as DUT 213. For instance, probe 211 is brought into contact with the appropriate pads for inputting test signals to DUT 213 and receiving output signals from DUT 213. Logic 202 of ATE 201 is then used to communicate input test data to DUT 213. For instance, such input test data may comprise a pattern of input signals designed to test the responsiveness of DUT 213 to various different input stimuli. Thereafter, signature generating logic 214 of DUT 213 generates a signature for the output values of DUT 213 responsive to the input test signals. Logic 203 of ATE 201 receives the generated signature from DUT 213, and logic 204 is used to compare the received signature to the expected signature 207 stored in data storage 206. Thus, it is determined whether the generated signature received from DUT 213 responsive to the input test data is as expected. This process may repeat for any number of input test patterns that are generated for testing DUT 213.

It should be recognized that because a signature is a compressed identification of the output bits, the amount of storage space required on ATE 201 for storing the output vector data (expected signatures 207) may be reduced well below that required for storing all of the actual expected output bits (as in the traditional system 100 of FIG. 1A). Thus, expected signatures 207 may consume less storage space within data storage 206 for implementing a given testing technique than would be consumed by traditional test solutions in which all expected bits are stored (such as expected raw data 107 in the example of FIG. 1A). Further, because a signature may uniquely identify an entire set of output bits desired to be analyzed (e.g., the entire output vector), test coverage is not reduced, as in the case of truncation.

However, as described above, signature analysis techniques of the existing art have several disadvantages. For example, such techniques include circuitry on-chip (e.g., circuitry 214) for generating a signature of the chip's output data during testing. Such signature generation circuitry consumes area on the chip, thus increasing the overall size of the chip (or decreasing the amount of circuitry that may otherwise be included in the chip) and potentially hindering the chip's performance. Further, such on-chip signature generation techniques typically do not allow for diagnosis of errors (e.g., determination of the specific output bit(s) that are incorrect) at the ATE. Thus, it should be recognized that an error map is not constructed in this example, as was constructed in the example of FIG. 1A. Various other disadvantages associated with signature analysis techniques of the existing art are described herein above, and because of such disadvantages, the use of signature analysis techniques to reduce the ATE memory requirements is not widespread. As the complexity of the DUTs and/or the comprehensiveness of the test coverage have increased, the desirability to conserve the amount of data storage required on an ATE for implementing a test has increased. Accordingly, a desire for an improved testing technique that conserves the amount of data storage required for implementing such testing technique (e.g., through use of signature analysis) but not having the disadvantages mentioned above has arisen.

As described above, proposals have also been made for a tester that generates a signature off-chip. For example, "Low-Cost Testing of High-Density Logic Components", *IEEE Design & Test of Computers*, 0740–7475 (April, 1990) proposes a tester that includes signature generation logic that receives output from a DUT and generates a signature for such received output. However, such proposed tester has several shortcomings. For instance, the proposed tester does not allow for simultaneous testing and error diagnosis. Further, the proposed tester does not allow for masking out of unknown states (e.g., masking of non-deterministic output bits) in generating a signature. Also, we are aware of no commercially available ATEs that implement the technique proposed by the "Low-Cost Testing of High-Density Logic Components" article. Further, if an ATE were implemented in accordance with such proposal, it would not allow for masking of unknown states, and if such masking were implemented it would require a substantial amount of mask data stored at the ATE (as no compression of the mask data is proposed).

Embodiments of the present invention provide a test solution that conserves the amount of data storage required at a tester (e.g., ATE) and also preferably minimizes the amount of on-chip circuitry required for such test solution. More specifically, embodiments of the present invention use signature analysis to achieve compression of the expected output data. Further, embodiments of the present invention use logic (e.g., software and/or hardware) arranged off the device under test (e.g., off a device on a wafer or a packaged device that is being tested) to generate a signature of the output of such device. For instance, in a preferred embodiment, logic is included within an ATE to receive raw output data from a DUT and generate a signature for at least a portion of the received raw output data (e.g., a portion of the received raw output data may, in certain implementations, be masked such that it is not utilized in generating the signature). Most preferably, the received raw output data is divided into a plurality of "windows," wherein each window is a predetermined number of bits, and a signature is generated in the ATE for each window and compared against an expected signature for such window to determine if the device is functioning as expected.

In a preferred embodiment, the data storage required at the ATE may be conserved in that expected signatures for the test solution may be stored thereto, as opposed to storing all of the actual expected output bits for such test solution. Further, in a preferred embodiment, circuitry for generating a signature of the DUT's output is not included on the DUT, thus minimizing the area required on the DUT for implementing the test solution. A further advantage of a preferred embodiment of the present invention is that it enables concurrent (or "single-pass") error evaluation (e.g., diagnosis/debugging). Thus, if an error is detected during testing, a second pass of inputting data to the DUT and receiving output data therefrom is not required for error evaluation (e.g., diagnosing the error for determining the specific output bit(s) that have an incorrect value). Further, a preferred embodiment of the present invention enables masking of received output data for generating a signature. Thus, non-deterministic bits of the received output data may be masked in accordance with mask data stored on the ATE that identifies the output bit(s) to be masked (or filtered) for the test. In accordance with certain embodiments of the present invention, compression techniques may be used for the mask data to further reduce the data storage requirements at the ATE. Various other advantages of embodiments of the present invention are described further below.

Figure 3A:
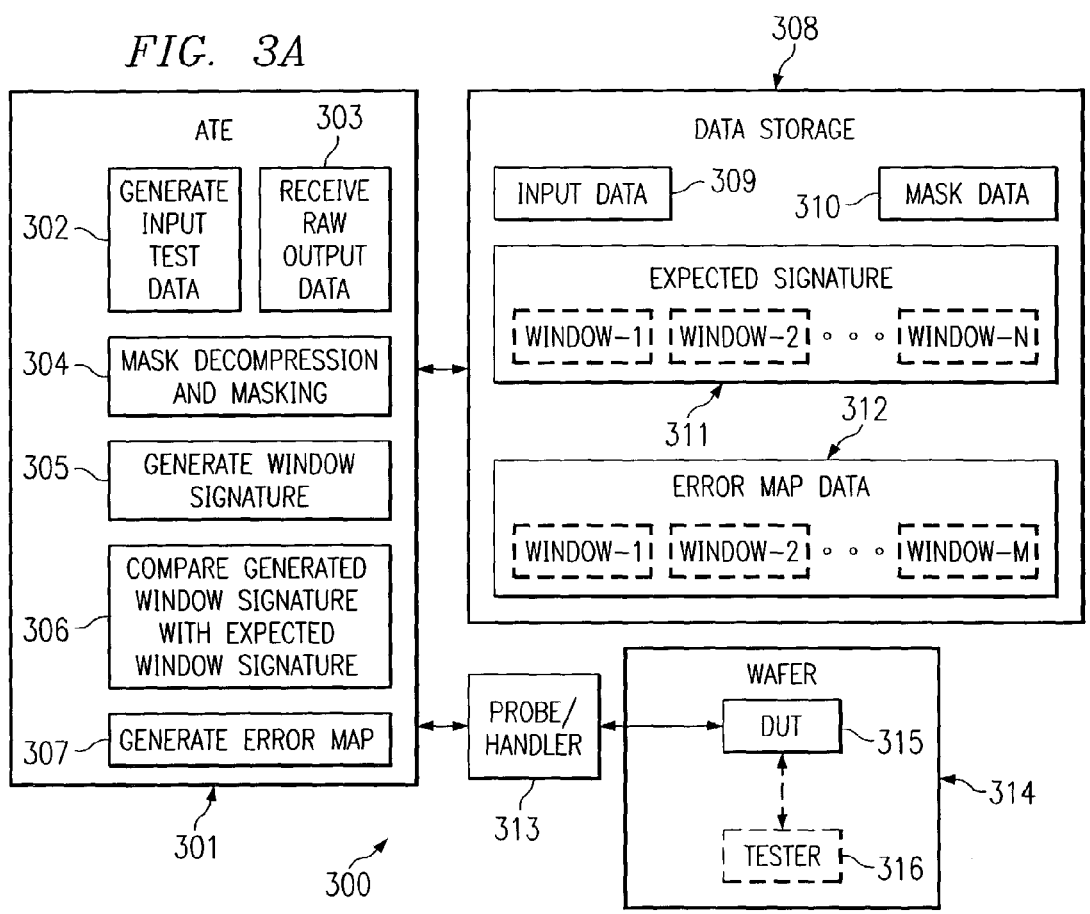
FIG. 3A shows an example block diagram of a test system of a preferred embodiment of the present invention.

Various embodiments of the present invention are now described with reference to FIGS. 3A–3B and 4–8, wherein like reference numerals represent like parts throughout the several views. Turning now to FIGS. 3A–3B, an example implementation of a preferred embodiment of the present invention is described in conjunction therewith. FIG. 3A shows an example block diagram of a test system 300 that utilizes signature analysis to compress the output vector data in order to conserve the amount of data storage required for implementing the testing technique. While many examples provided herein (including the example of FIG. 3A) describe testing a device that is on a wafer, it should be understood that the present invention is not so limited in application. Rather, other DUTs may be tested using embodiments of the present invention, including a DUT that has been packaged, for example.

Testing system 300 comprises ATE 301, which is communicatively coupled to probe 313. As described further below, probe 313 may be used to communicate input data to one or more DUTs, such as DUT 315 on wafer 314, and receive output data from such DUTs. As shown, data storage 308 is communicatively coupled to ATE 301 and stores information needed for performing the testing of DUT 315, such as input vector data 309, output signature data 311, and mask vector data 310 for the test. Further, error map data 312 may be stored within data storage 308, as described further below.

As further shown, ATE 301 comprises logic 302 for generating input test data to be input to DUT 315, logic 303 for receiving raw output data from DUT 315 responsive to the input test data, logic 304 for decompressing mask data 310 and masking the appropriate bits of the received output data, logic 305 for generating a signature of at least a portion of the received output data (i.e., the non-masked output data) received from DUT 315, logic 306 that is operable to compare the generated signature with expected signature 311, and logic 307 for generating error map 312 for failed tests. As described further below, preferably logic 305 generates a signature for each of a plurality of windows of the received output bits, and each window signature is compared with an expected window signature in logic 306. Each of logic 302, 303, 304, 305, 306, and 307 of ATE 301 may comprise software and/or hardware for performing their respective tasks.

In operation of a preferred embodiment, probe 313 may be brought into contact with the appropriate access pads for testing one or more DUTs, such as DUT 315. For instance, probe 313 may be brought into contact with the appropriate pads for inputting test signals to DUT 315 and receiving output signals from DUT 315. Logic 302 of ATE 301 is then used to communicate input test data to DUT 315. For instance, such input test data may comprise a pattern of input signals designed to test the responsiveness of DUT 315 to various different input stimuli. Thereafter, logic 303 of ATE 301 receives the raw output data generated by DUT 315 responsive to the input test data. Thus, ATE 301 communicatively interfaces (e.g., via probe 313) with DUT 315 in order to input test data to DUT 315 and receive raw output data from DUT 315.

Logic 304 of ATE 301 may be included to mask certain received output bits (e.g., non-deterministic bits) from being used in generating a signature. As described below, mask data 310 is preferably compressed, and logic 304 is therefore operable to decompress mask data 310 and use such mask data 310 in masking the appropriate received output bits. Logic 305 of ATE 301 generates a signature for at least a portion of the received output values (e.g., the non-masked output bits) from DUT 315. As mentioned above, in certain embodiments the received output data may be organized into windows, and logic 305 may generate a signature for each window of bits. Logic 306 is then used to compare the generated signature with the expected signature 311 stored in data storage 308. Again, preferably a signature of a window of received output bits is compared with an expected signature for such window of bits. Thus, it is determined whether the generated signature for the output data received from DUT 315 responsive to the input test data is as expected. If it is determined that the generated signature (e.g., window signature) is not as was expected responsive to the input data (i.e., the generated signature for a window of bits does not match the expected signature 311), then logic 307 may generate information in error map 312 about this failed test. Such error map information may comprise such information as an identification of the window number that failed and an error log of the expected data and actual received data (e.g., actual received raw output bits) for the failed window, as examples. It should be recognized that this error evaluation may be performed concurrently with testing of DUT 315. That is, once an error is detected (e.g., by logic 306 detecting that a generated signature fails to match an expected signature), ATE 201 need not access DUT 315 again for evaluating (e.g., diagnosing and/or debugging) the detected error, but rather the raw output data received by ATE 201 during testing (which resulted in the generation of errored signature) may be used for evaluation (e.g., stored to an error map log). This process may repeat for any number of input test patterns that are generated for testing DUT 315.

FIG. 3B shows an example operational flow of the test system 300 of FIG. 3A. It should be understood that while FIG. 3B shows an example of the general operation of system 300, such operational flow will generally be implemented in a bit-wise fashion. For example, in operational block 322, a bit of output data is received and operation advances for such bit in a bit-wise fashion similar to that described above in conjunction with FIG. 1B. Although not shown specifically as bit-wise operations, the example of FIG. 3B provides an example of the general operation of system 300.

As shown, in operational block 321, test data is input from an off-chip tester (e.g., from ATE 301) to DUT 315. In operational block 322, the off-chip tester receives output data from DUT 315 that is output responsive to the input test data. In operational block 323, a certain portion of the received output data (e.g., certain bits) may be masked by the off-chip tester (e.g., by masking logic 304), as is described further herein below. For example, certain bits of the received output data may be non-deterministic (e.g., may not indicate whether DUT 315 is functioning properly responsive to the input pattern), (for example, due to having multiple clock domains, partial scan approaches, or tri-state busses), such bits can be masked to prevent corruption of the signature. In addition, for a certain portion of the test, the user typically does not care about the output (for example because the test covers defects that rarely occur or during diagnosis/debugging). These bits may also be masked (or filtered) from the received output data in operational block 323. As described further below, mask data 310 is preferably compressed, and thus operational block 323 may comprise decompressing such mask data 310 and using the mask data for masking out the appropriate received output bit(s).

In operational block 324, those output bits that have not been masked in block 323 are used by the off-chip tester to generate a signature. Preferably, the output bits are divided into windows such that the non-masked bits of a window are compressed into a signature of such window in operational block 324. Thereafter, in operational block 325, the off-chip tester compares the generated signature with a stored expected signature (e.g., expected signature 311 stored in data storage 308) to determine whether the generated signature matches the expected signature. If it is determined that the generated signature matches the expected signature, then it is determined in operational block 326 that the output of DUT 315 passes this test, and operation may return to block 321 to perform further testing (e.g., inputting further test patterns to DUT 312). However, if the generated signature does not match the expected signature, then it is determined that DUT 315 fails this test and information about such failure may be stored to error map 312, which may be used in error evaluation (e.g., debugging DUT 315 to determine the reason that it failed this test). More specifically, if a window signature fails to match an expected window signature, then the actual received raw output data of such window may be stored to error map 312 for error evaluation (e.g., diagnosing such error for determining which specific bit(s) had incorrect values). Thus, data for failed windows Window-1 through Window-M (wherein M is less than or equal to N) is stored to error map data 312. Accordingly, for N windows of expected signature 311, data for the failed M windows, which is typically much less than the number N (and thus conserves storage requirements of error map data 312) is stored to error map data 312. It should be recognized that because the actual raw output data is received by the off-chip tester, such error evaluation may be performed concurrent with testing of the DUT. That is, a further pass through the DUT (e.g., inputting information and/or receiving output) is not required after an error is detected, but instead if the generated signature for a window of output bits fails to match an expected signature for that window, the actual output bits of the failed window may be stored to an error map for evaluation of the error without requiring further interaction with the DUT (e.g. for the purpose of yield learning).

It should be recognized that because a signature is a compressed identification of a group (e.g., window) of output bits, the amount of storage space required in data storage 308 for storing the output vector data (expected signatures 311) may be reduced well below that required for storing all of the actual expected output bits (as in the traditional system 100 of FIG. 1A). Thus, expected signatures 311 may consume less storage space within data storage 308 for implementing a given testing technique than would be consumed by traditional test solutions in which all expected bits are stored (such as expected raw data 107 in the example of FIG. 1A). Further, because a signature may identify an entire set of output bits desired to be analyzed (e.g., the entire output vector), test coverage is not reduced, as in the case of truncation. Thus, the amount of data storage required for storing the output vector data for a test may be minimized without sacrificing the quality of the testing. Additionally, by implementing the signature generation logic off of the device under test (e.g., off of a die on a wafer or a packaged device that is under test), many of the above-described disadvantages of prior signature analysis techniques (that are implemented on-chip) may be overcome. For instance, additional area is not required within the die under test to implement signature generation circuitry. Further, as described above, diagnosis of errors may be performed concurrently with testing. Also, a preferred embodiment enables masking of certain received output bits (e.g., non-deterministic bits) from the signature generation via masking logic 304. Masking logic 304 may mask output bits in accordance with mask data 310 for a given test. As described further below, in certain embodiments masking data 310 may also be compressed, thus further reducing the data storage requirements of ATE 301.

As described above, signature generation logic is preferably included within ATE 301, as shown in the example of FIG. 3A, or within another type of tester now known or later developed that is arranged external to the wafer 314 on which the DUT 315 is located. However, in alternative embodiments, such signature generation logic may be implemented within any other off-chip tester (i.e., tester arranged external to DUT 315) that may be utilized for testing DUT 315. For example, in certain embodiments, a tester that is external to DUT 315 may be included on wafer 314 for performing some or all of the above-described functionality of ATE 301 (e.g., inputting test data to DUT 315, receiving output data from DUT 315, generating a signature for the output data, comparing the signature with an expected signature, and/or generating an error map if the signature fails to match the expected signature).

For instance, a first die, such as die 316 shown in dashed-line in FIG. 3A as being optional, of wafer 314 may be implemented for testing die 315 on such wafer 314. An example configuration that enables one die of a wafer to test another die of the wafer is described further in co-pending and commonly assigned U.S. patent application Ser. No. 10/155,651 entitled "SYSTEM AND METHOD FOR TESTING CIRCUITRY ON A WAFER", the disclosure of which is hereby incorporated herein by reference. In such configurations, signature generation logic may be included in the first die 316 for generating a signature for the output of die 315, wherein signature generation logic is not required in die 315 being tested. More specifically, in certain implementations, tester circuitry 316 may input test data (e.g., a test pattern) to die 315. Alternatively, probe 313 and ATE 301 may be utilized to input such test data. Tester circuitry 316 may receive the output from DUT 315 responsive to the input test data, and tester circuitry 316 may generate a signature for at least a portion of the received output data. Thereafter, tester circuitry 316 may compare the signature with an expected signature to determine if DUT 315 is functioning properly. Alternatively, the signature generated by circuitry 316 may be communicated (e.g., via probe 313) to ATE 301, and ATE 301 may make such a comparison of the generated signature with an expected signature to determine whether DUT 315 is functioning properly.

Embodiments of the present invention may be implemented in a combination with mask vector compression and/or input vector compression techniques for a test. That is, not only may the output vector data 311 be compressed through use of signatures, but also input vector data 309 and/or mask vector data 310 may also be compressed. By compressing the output data 311, input data 309, and mark data 310, as well as minimizing the amount of error map data 312 (through use of windows), a preferred embodiment greatly reduced the data storage requirements 308 of ATE 301 for implementing testing of a DUT.

Various techniques may be used for compression of the input data 309 and mark data 310. For example, in certain embodiments of the present invention, the mask data (e.g., mask data 310 of FIG. 3A) can be categorized in packets of a fixed number of bits. Two different packet types can be defined: (1) zero packet, i.e. packet of all 0s, and (2) a deterministic packet with both 1s and 0s. Packets of the first type (zero packets) can be replaced by one control bit designating the fact that it is a zero packet. Packets of the deterministic type comprise control bits designating the type together with the original packet. Since the number of 1s is generally very sparse (e.g., 1s may designate the bits that are to be masked for a given test), a few control bits can replace a lot of the original bits.

The optimal packet size depends on the statistical distribution of the 1s, i.e. it varies across devices. Instead of using only two different packet types, more packets types can be introduced in certain implementations. For example, a packet size for all 1s can be introduced.

The above type of mask compression can work very well together with input compression approaches, such as that described in co-pending and commonly assigned U.S. patent application Ser. No. 09/802,440 titled "TEST VECTOR COMPRESSION METHOD" filed Mar. 9, 2001, the disclosure of which is hereby incorporated herein by reference.

Since the number of 1s in the mask data set is generally sparse, the mask data can be compressed using run-length encoding techniques. To encode the lengths, normal fixed-length code words can be used. Well-known Huffman codes can be used, for example, to attach shorter code words to lengths that occur with a higher probability. The codes can be derived using a Huffman tree. Only a limited number of lengths can be encoded. Other suitable compression coding techniques may be utilized, including without limitation, well-known alias-$\gamma$, well-known alias-$\Delta$, well-known fibonacci codes, any sparse matrix codes, or any other suitable compression schemes now known or later developed.

By using well-known Golomb-Rice encoding, all lengths can be directly encoded, while still maintaining a simple hardware decoder implementation. A Golomb-Rice codeword consists of a concatenation of a variable-length prefix of n bits and a fixed-length tail of m bits (representing a decimal value of q), making the total length of the codeword n+m bits. The n bits prefix starts with n-1 0s and the last bit is always 1 (notation: $0^{n-1}1$). This way, decoding the prefix (n) is reduced to only counting the number of 0s. The tail is a normal binary fixed-length code. The value of a Golomb-Rice codeword is defined as $n \cdot 2^m + q$ Table 1 gives an example of 8 different lengths encoded using Fixed-Length codes, Huffman codes, and Golomb-Rice codes.

TABLE 1

Binary encoding techniques for the group size

| Size | Prop. | Fixed-length | Huff-man | Golomb-Rice Prefix | Tail |
|---|---|---|---|---|---|
| 1 | 60% | 000 | 01 | 1 | 001 |
| 2 | 20% | 001 | 100 | 1 | 010 |
| 3 | 10% | 010 | 001 | 1 | 011 |
| 4 | 4% | 011 | 110 | 1 | 100 |
| 8 | 2% | 100 | 101 | 01 | 000 |
| 16 | 2% | 101 | 111 | 001 | 000 |
| 32 | 1% | 110 | 0000 | $00001 = 0^41$ | 000 |
| 128 | 1% | 111 | 0001 | $0^{16}1$ | 000 |

Various other advantages of embodiments of the present invention will be recognized by those of ordinary skill in the art.

In traditional testing techniques, all bits of the expected output data are stored in the ATE memory as the output vector data for a test, such as expected output data 107 stored in data storage 106 of FIG. 1A. However, in a preferred embodiment of the present invention, only "window signatures" (which, as used herein refer to a signature for a window of bits) are stored in data storage 308 for the output vector data for a test. For instance, in the example of FIG. 3A, expected signature data 311 comprises a plurality of window signatures, shown as Window-1, Window-2, . . . , Window-N. A window signature is defined as being a signature based on only a window of a certain predetermined number of bits, i.e., the window size. The window size can be made variable across the test of different devices or even within the test of one device.

As an example, assume that responsive to an input, a DUT outputs 10 bits. In this case, the first 5 of the output bits may be allocated to a first window that is used for generating a first signature, and the second 5 of the output bits may be allocated to a second window that is used for generating a second signature. As a further example, assume that a test comprises 10 different test patterns to be input to a DUT, and the output bits from the DUT (which may comprise any number of output bits) responsive to each of the 10 different test patterns may be evaluated to determine whether the DUT is functioning properly. In certain implementations, the output bits responsive to each of the 10 different input test patterns may be allocated to a different window that is used for generating a signature. For instance, the output bits from the DUT responsive to a first input test pattern may be allocated to a first window, the output bits from the DUT responsive to a second input test pattern may be allocated to a second window, and so on.

Dividing the received output bits into windows in this manner offers certain advantages. For example, it may be used to enable conservation of the data storage required for storing error map data 312. For instance, upon detecting an error for a particular window (e.g., the window's signature fails to match the expected signature for such window), the output data bits of such particular window may, in certain implementations, be stored to the error map, as opposed to storing all of the received output bits. Of course, in other implementations all (or any other desired amount) of the received output data for the DUT may be stored to the error map upon detection of an error. Further, in certain implementations, one or more of the error map data windows may be off-loaded to an external storage device that is communicatively coupled to tester 301, thus freeing some of data storage 308 of tester 301 for storing more error data. Various other advantages of using windows in the manner disclosed herein will be recognized by those of ordinary skill in the art.

Turning to FIG. 4, an example flow chart is shown that illustrates how expected window signatures, such as the window signatures 311 of FIG. 3A, are created in a preferred embodiment. Such expected signatures would typically be generated on a computer, such as the example computer of FIG. 7 described below, and then loaded onto ATE 301. As shown, in operational block 401, the signature generation program determines whether a next window of expected output bits is available for a given test. Such output bits may be generated through, for example, simulation of the DUT with the input test patterns. For instance, for a given test for a particular device to be tested, one or more patterns of input test values may be provided, and the particular device is expected to generate particular output data values responsive to each of the input test patterns. Accordingly, the test may be "modeled", in a sense, to determine the various output data values that are expected from the device responsive to the input test patterns when the device is functioning properly. The expected output data values may be distributed across a plurality of "windows." As described above, a "window" may comprise a certain predetermined number of output bits which may, in certain implementations, be variable across the test of different devices or even within the test of one device. For instance, various windows of different sizes may be used in testing a given device. Further, the size and number of windows used may vary from one device test to another. Preferably, a user may specify the window size to be used for a given test.

Thus, in operational block 401, it is determined whether all of the expected output bits (responsive to an input test stimuli) that comprise a next "window" are available. If no further windows of output data bits are expected for the test, then it is determined at block 402 that the signature generation is complete (all of the necessary window signatures for the test have been generated). Thus, at block 402, the test is ready to be performed on actual devices. However, if it is determined at block 401 that a next window of output bits are available for the signature generation (e.g., expected output bits responsive to a given input test pattern), then operation advances to operational block 403 whereat the signature generation logic (e.g., software and/or hardware, such as a SISR, MISR, or Cellular Automata logic) is reset such that it is made ready to receive a window of output bits and generate a signature for such window.

In operational block 404 one or more "don't care" bits of the window of output bits may be masked. For example, certain output bits may have a non-deterministic behavior (e.g., may not indicate whether a DUT is functioning properly responsive to the input pattern, and hence will result in signature corruption if it is not masked out), and such bits whose value the test doesn't care about may be masked (or filtered) from the window of output data. Such mask data is preferably stored to data storage 308 as mask data 310 for the generated test when the test is loaded onto ATE 301. As described above, mark data 310 is preferably compressed, and thus such data is decompressed and used in operational block 404 for masking out the appropriate bits. Then, in operational block 405, a model of the signature generation logic 305 of ATE 301 is utilized to generate a signature for the remaining (non-masked) output bits of the window. For example, in certain embodiments, a model of signature generation logic 305 may implement a SISR, MISR, or Cellular Automata (as hardware and/or software), and such SISR, MISR, or Cellular Automata may accumulate (generate) a signature for the non-masked expected output bits of a window. Thus, the signature generation logic 304 generates an expected signature window that is expected for the corresponding portion of the test when performed on an actual device (if the device is functioning properly). Once such expected signature window is generated, it is stored, in operational block 406 (e.g., to data storage 308 of ATE 301). As described further below, such stored expected signature windows are used during the actual testing of circuitry to determine whether the output of such circuitry responsive to test input values is as expected.

Figure 5:
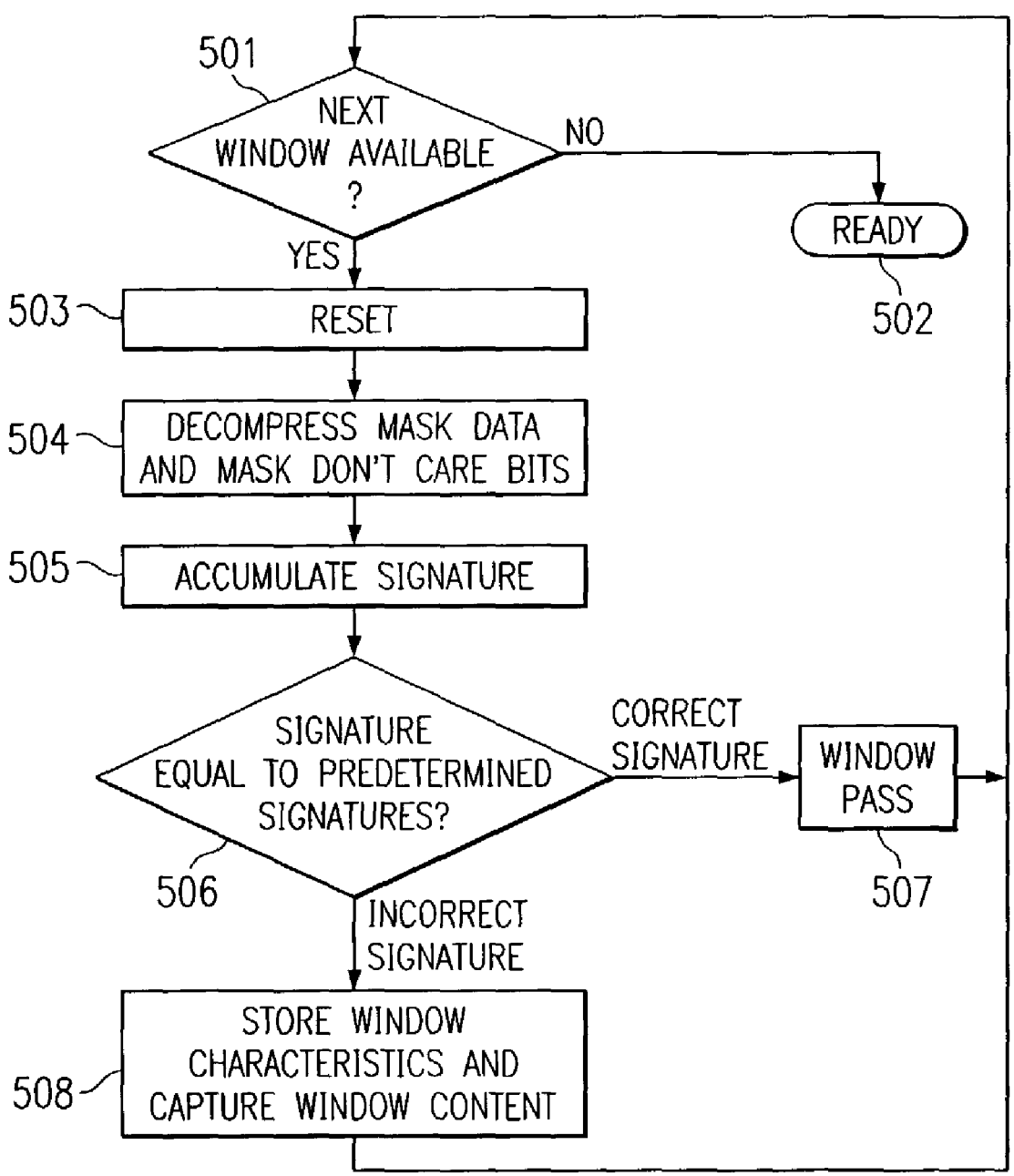
FIG. 5 shows an example flow chart that illustrates an operational flow of a testing technique in accordance with a preferred embodiment of the present invention.

Turning to FIG. 5, a flow chart is shown that illustrates an example operational flow of a testing technique of a preferred embodiment of the present invention. As shown, in operational block 501, the off-chip tester (e.g., ATE 301) determines whether a next window of output bits is available from a DUT (e.g., DUT 315). More specifically, input test data is input from the tester to the DUT, responsive to which the DUT generates output data. In operational block 501, the tester determines whether all of the output bits (responsive to the input data) that comprise a next "window" are received from the DUT. If no further windows are expected from the DUT for this test, then it is determined at block 502 that the testing is complete. However, if it is determined that a window of output bits have been received from the DUT responsive to a given input test pattern, then operation advances in the off-chip tester to operational block 503 whereat the signature generation logic (e.g., logic 305 of ATE 301 in FIG. 3A) is reset such that it is made ready to receive a window of output bits and generate a signature for such window. As described above, in certain implementations the signature generation logic of the tester may implement a SISR, a MISR, or a Cellular Automata, in which case such SISR, MISR, or Cellular Automata is reset in block 503.

In operational block 504 one or more "don't care" bits of the received window of output bits may be masked (using mask logic 304, for example). For example, certain output bits may have a non-deterministic behavior (e.g., may not indicate whether DUT 315 is functioning properly responsive to the input pattern), and such bits whose value the test doesn't care about may be masked (or filtered) from the received window of output data. The same bits that were masked in operational block 404 of FIG. 4 in generating an expected signature window are also masked in operational block 504 such that the same output bits as were used to generate the expected signature window in FIG. 4 are used to generate a signature window for the output of the DUT (of course, if the DUT is not functioning as expected then the values of such output bits may differ from the expected values used in generating the expected signature window in FIG. 4). Preferably, an identification of the output bits to be masked for the test is included in mask data 310, which may be compressed in certain embodiments, as described above.

Then, in operational block 505, the signature generation logic of the off-chip tester is utilized to generate a signature for the remaining (non-masked) output bits of the window. For example, in certain embodiments, the tester may implement a SISR, MISR, or Cellular Automata (as hardware and/or software), and such SISR, MISR, or Cellular Automata may accumulate (generate) a signature for the received (and non-masked) output bits of a window. Thus, a signature window is generated for the received (and non-masked) output bits from the DUT (using logic 305, for example).

Thereafter, in operational block 506, the tester compares the generated signature window with a stored expected signature window for this portion of the test to determine whether the generated signature window matches the expected signature window. If it is determined that the generated signature window matches the expected signature window, then it is determined at operational block 507 that the window of received output bits passes this test, and operation may return to block 501 to perform further testing (e.g., to evaluate further windows of output data received from the DUT). However, if the generated signature window does not match the expected signature window, then it is determined that the DUT fails this test, and information about such failure may be stored in operational block 508 to an error map (e.g., error map 312 of FIG. 3A). For instance, in certain implementations, characteristics and/or content of the failed window of output bits (e.g., the actual raw output bits) may be stored to an error map, and such stored error map information may be used in error evaluation (e.g., diagnosing the error to determine which bit(s) were incorrect and/or debugging the DUT to determine the reason that it failed this test).

In a preferred embodiment, error evaluation of a DUT error may be performed concurrently with the signature analysis testing of such DUT. In prior art signature analysis techniques, such concurrent testing and error evaluation of the DUT is not available. In fact, providing error evaluation (e.g., error diagnosis) at all using signature analysis techniques of the prior art is generally very difficult. With prior art signature analysis techniques, it is very computationally intensive, and sometimes impossible, to reverse the signature analysis process. In other words, by using signature analysis techniques of the existing art, it is possible to determine a discrepancy between the actual output vector data and the expected output vector data. However, it is typically not possible to determine which received bits of the output vector data are wrong. This seriously limits the diagnosis capability of signature-based testing methodologies of the existing art. A preferred embodiment of the present invention eases the error diagnosis of signature analysis because the signature is not required to be reversed for diagnosis, but rather the corresponding raw output data received by the tester for a failed window may be written to an error log.

Moreover, if error evaluation (e.g., diagnosis) is performed at all in prior art signature analysis techniques, it is not performed concurrently with the testing of the DUT. Rather, the testing (e.g., inputting of test data to the DUT, generating a signature for output data of the DUT, and comparing the generated signature with an expected signature) is first performed, and if error evaluation is desired (e.g. in response to a generated signature failing to match an expected signature), then a second pass is made through the DUT with the signature logic bypassed to send the response directly to ATE. That is, a second set of interactions between the tester and the DUT is required to diagnose/debug the DUT.

In other approaches, multiple signatures are created, such that the location (within the range of the area of which the signature is created) of the error is known. Still, after that, a second pass is made through the DUT with the signature logic bypassed to send the response directly to the ATE.

As described above, when a discrepancy between the expected window signature and the generated window signature for received output data is found in a preferred embodiment of the present invention, the window characteristics can be stored in the error map (e.g., the window ID, the actual and expected raw output data, the cycle number, etc.). The start of the windows in the input/output vector data can, for example, be designated by start cycle register(s) or by control bits at the input vector data. The length of a window can be designated by a length register(s), which may preferably be dynamically altered for a test by user input. It is also possible to designate the window lengths by control bits at the input vector data, either by combining it with the "start of the window" control bits or by designating the "end of a window."

Instead of only capturing one failed window, it is possible to have a counter that designates how many failed windows need to be captured (e.g., before storing error map data for the DUT). For example, during intensive analysis of a DUT a user might desire to capture information for more than 1 failed window, whereas during fast production testing a user might desire to capture only the first failed window for a DUT.

Figure 6:
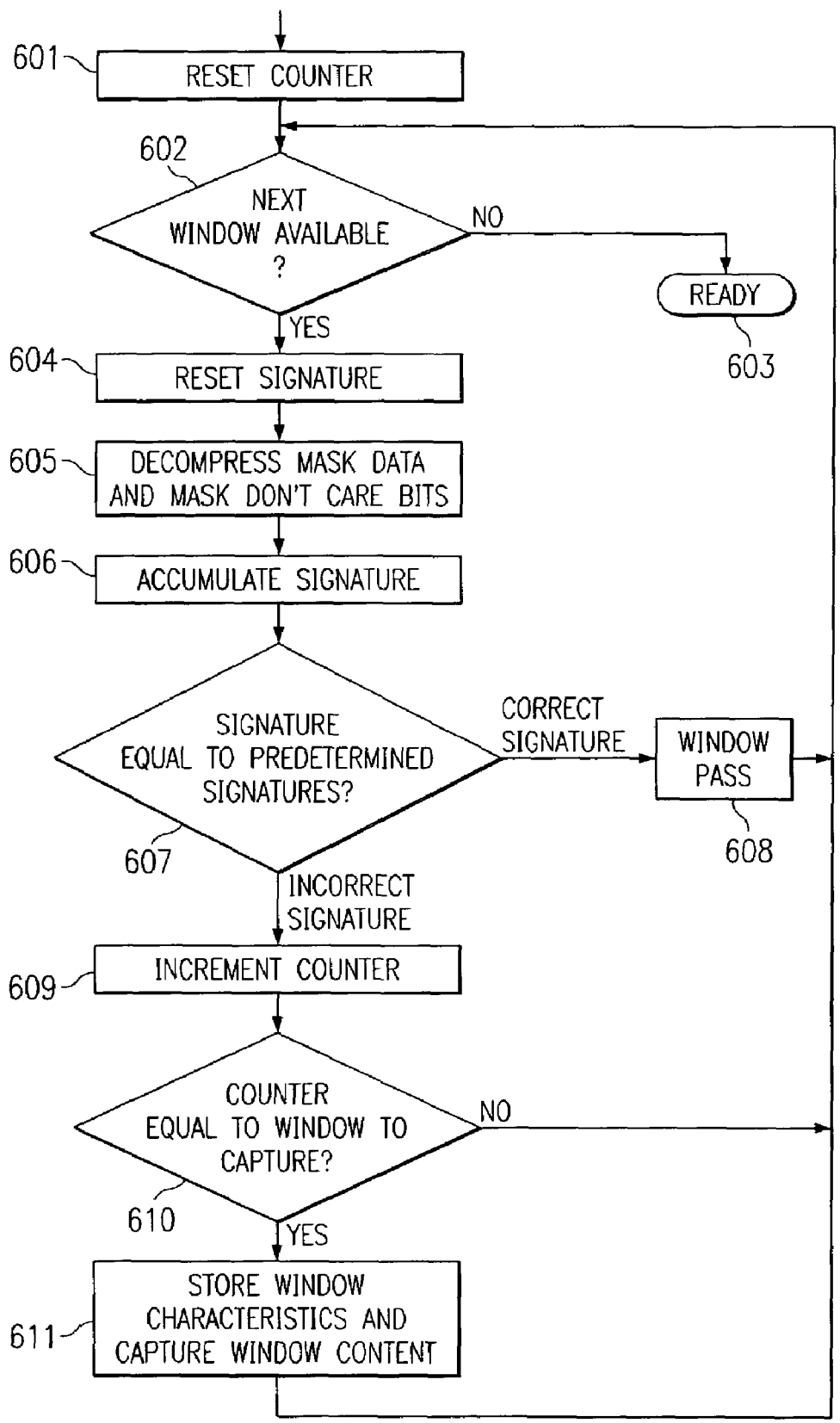
FIG. 6 shows an example operational-flow diagram of one embodiment of the present invention in which capturing of error information starts after detection of a predetermined target number of failed windows for a device under test.

It is possible to reduce the memory requirements further, by introducing a counter that is used to start capturing error map information after the nth window or the nth failed window. This way, not all of the previous failed windows need to be stored in the memory at the same time. For example, FIG. 6 shows an operational flow chart of one embodiment of the present invention in which capturing of error information starts after the nth failed window. In operational block 601, a counter that is used for counting failed windows is reset (e.g., to 0). Thereafter, testing of a DUT is performed in a similar manner as that described above in conjunction with FIG. 5. For instance, operational blocks 602–608 correspond to operational blocks 501–507 of FIG. 5.

However, in the embodiment of FIG. 6, if it is determined at operational block 607 that a window signature generated for received output of a DUT (the signature generated in operational block 606) does not match the expected window signature for this portion of the test, then operation advances to block 609 whereat the failed window counter is incremented. Thereafter, it is determined in operational block 610 whether the counter is equal to a predetermined target number of failed windows. In this embodiment, error information is captured only if a predetermined target number of failed windows is captured for a DUT. Of course, a DUT may fail the testing and be determined of improper quality to ship as product even if only one window fails, but error information is captured (e.g., for error evaluation) only if a predetermined target number of failed windows occurs during the testing of the DUT. Thus, if it is determined in operational block 610 that the predetermined target number of failed windows has not been reached, then operation returns to block 602 to evaluate the next window. If, on the other hand, it is determined in operational block 610 that the predetermined target number of failed windows has been reached, operation advances to block 611 to store information (e.g., window characteristics and/or window content) about the failure. Thereafter, operation may return to operational block 602 to continue the testing process.

By using this approach the output memory requirements of the ATE are now reduced from the total output vector data size to the maximum of the window size and the size of all window signatures. The memory requirements of the ATE can be reduced further by sending out the captured windows during the test to another data storage device, such as to a workstation communicatively coupled to the ATE. In this case, the error map stored on the ATE is essentially merely used as a buffer. The number of windows in the error map buffer is determined by the failed window frequency and the available bandwidth to transfer captured windows during the test to, for example, a workstation.

If correlation with the conventional flow is not that important, the following generalizations can be made. It is possible to only capture the received output data stored to the error map after multiple hierarchical iterations, either with or without a counter for the number of captured failed windows or the first captured failed window. In this case, different predetermined window sizes can be used to iterate (or zoom) into a smaller sub window. Consequently, the required memory size is only the maximum of the size of the last window iteration and the size of the signatures itself, instead of the maximum of the size of one of the larger previous windows and the size of the signatures itself. The optimal window size becomes a trade-off between the number of acceptable iterations desired and the required output compression ratio desired.

In view of the above, in a preferred embodiment, a signature is generated on a tester, such as an ATE, that is external to the DUT (e.g., an off-chip tester) for at least a portion of output data received from the DUT, and such signature is compared with an expected signature in order to determine whether the DUT is functioning properly. In a preferred embodiment, the DUT is on a wafer and the tester comprises a system that is external to the wafer on which the DUT is arranged. For instance, in one implementation of a preferred embodiment, the tester comprises an ATE, such as ATE 301 of FIG. 3A. Various elements of the tester, such as the logic 302 for inputting test data to a DUT, logic 303 for receiving output data from the DUT, logic 304 for masking bits, logic 305 for generating a signature of at least a portion of the received output data (e.g., the non-masked data), logic 306 for comparing the generated signature with an expected signature, and logic 307 for generating an error map for a failed test, may comprise hardware and/or software. When implemented as executable instructions or software code, such code may be obtained by the tester from a computer-readable medium (e.g., a hard drive media, optical media, read-only memory (ROM), random access memory (RAM), tape media, cartridge media, flash memory, memory stick, and/or the like) or communicated via a data signal from a communication medium (e.g., the Internet). In fact, readable media can include any medium that can store or transfer information.

FIG. 7 illustrates an example computer system 700 that may be utilized for generating expected signatures to be used by a tester. Central processing unit (CPU) 701 is coupled to system bus 702. CPU 701 may be any general purpose CPU. Suitable processors include without limitation INTEL's PENTIUM® 4 processor, for example. However, the present invention is not restricted by the architecture of CPU 701 as long as CPU 701 supports the inventive operations as described herein. CPU 701 may execute the various logical instructions for generating desired expected signatures (e.g., window signatures) for a test. For example, CPU 701 may execute machine-level instructions according to the exemplary operational flows described above in conjunction with FIG. 4.

Computer 700 also preferably includes random access memory (RAM) 703, which may be SRAM, DRAM, SDRAM, or the like. Computer 700 may, for example, utilize RAM 703 to store (at least temporarily) the various expected signatures generated for a particular test being modeled. Computer 700 preferably includes read-only memory (ROM) 704 which may be PROM, EPROM, EEPROM, or the like. RAM 703 and ROM 704 hold user and system data and programs as is well known in the art.

Computer 700 also preferably includes input/output (I/O) adapter 705, communications adapter 711, user interface adapter 708, and display adapter 709. I/O adapter 705 and/or user interface adapter 708 may, in certain embodiments, enable a user to interact with Computer 700 in order to input information (e.g., for specifying a test for a DUT, specifying a window size, specifying a target number of failed windows after which error information is to be captured (as in the example flow of FIG. 6), and/or specifying information, such as masked-bits, to be used in generating expected signatures). Further, I/O adapter 705 may be coupled to a printer 714 to enable information to be printed thereon.

Additionally, I/O adapter 705 preferably connects to storage device(s) 706, such as one or more of hard drive, compact disc (CD) drive, floppy disk drive, tape drive, etc. The storage devices may be utilized when RAM 703 is insufficient for the memory requirements associated with modeling a test and generating expected signatures.

Communications adapter 711 may be included, which is adapted to couple Computer 700 to network 712, which may be any suitable communications network, such as a telephony network (e.g., public or private switched telephony network), local area network (LAN), the Internet or other wide area network (WAN), and/or wireless network. User interface adapter 708 couples user input devices, such as keyboard 713, pointing device 707, and/or output devices, such as audio speaker(s) (not shown) to Computer 700. Display adapter 709 is driven by CPU 701 to control the display on display device 710 to, for example, display information to a user about a device test being conducted. It shall be appreciated that the present invention is not limited to the architecture of system 701. For example, any suitable processor-based device may be utilized for generating expected signatures for a test (including, in certain implementations, the off-chip tester, e.g., ATE 301).

FIG. 8 illustrates a block diagram of an exemplary tester, ATE 301, which may be adapted to implement embodiments of the present invention. In the embodiment of FIG. 8, computer system 700 is shown coupled to ATE 301, such as via communications adapter 711 of FIG. 7, and may provide download of test plans, test data (e.g., input test data, expected signatures for a test, etc.), and/or other interfacing functionality with respect to ATE 301. Such test plans and test data may be loaded into ATE memory (e.g., memory 308 of FIG. 3A may be included in test resources 820) via access control logic 810. Test resources 820 may comprise the aforementioned resources 302–307 described above in FIG. 3A. In the illustrated embodiment, test resources 820 are coupled to controller/sequencers 840 via interconnection network 830. Controller/sequencers 840 preferably operate to couple ones of the test resources 820 to ones of pins 860 (such as may be disposed upon a probe or probes, such as probe 313 of FIG. 3A) to apply appropriate test data to the DUT(s) at the times and sequences set forth in the test plan being utilized. Pin electronics cards 850 are disposed between controller/sequencers 840 and pins 860 of the illustrated embodiment to provide the particular voltage levels required by the DUT(s).

It should be appreciated that, although the illustrated embodiment shows three test resources, controller/sequencers, and pin electronics cards, ATE 301 may comprise any number of items. Moreover, there is no limitation that a same number of each such items be provided according to the present invention. Further, the embodiment of FIG. 8 is intended solely as an example of a configuration of an ATE which may implement embodiments of the present invention, and the present invention is not intended to be limited to such example configuration. Rather, any other suitable off-chip tester configuration now known or later developed that may be configured to receive raw output data from a DUT and generate a signature (as is described more fully above with FIG. 3A) is intended to be within the scope of the present invention. Further, in certain embodiments, the tester may be implemented on a wafer and be utilized for testing other circuitry (DUTs) on such wafer. For instance, in certain embodiments, a tester may be implemented on a first die of a wafer, and may be used for testing at least one other die of the wafer.

In view of the above, it should be recognized that embodiments of the present invention may be implemented to provide many advantages over the testing techniques of the existing art. For example, in accordance with embodiments of the present invention, a similar compression ratio to that of traditional signature analysis techniques can be achieved, but without the need for design modifications in the DUT. Because of this, there is no potential silicon area overhead on the DUT for implementing the test and no potential performance degradation of the DUT. As a further example, in accordance with embodiments of the present invention, a similar compression ratio to that of traditional signature analysis techniques can be achieved, but without any limitations in error diagnosis capability.

Further, in a preferred embodiment, diagnosis of errors (and yield learning) may be performed concurrently with testing of a DUT. That is, a "first pass" may be made in which the off-chip tester interacts with the DUT by inputting input test data and receiving raw output data therefrom, and from such "first pass" the off-chip tester may generate a signature and use such signature to detect an error with the DUT, wherein if an error is detected the actual output data received from the DUT may be stored to an error map log without requiring further interaction with the DUT for acquiring such output data. Because error diagnosis may be performed concurrently with the testing of a DUT, certain embodiments of the present invention are particularly suited for implementation in a high-volume production test setting.

Further, a preferred embodiment of the present invention divides the received output bits into a plurality of windows, and generates signatures for each individual window. Utilization of windows in this manner provides certain advantages, such as enabling conservation of the data storage required for storing error map data (e.g., by storing error data associated with a failed window, i.e., a window whose signature fails to match the expected signature for such window). Various other advantages of using windows in the manner disclosed herein will be recognized by those of ordinary skill in the art.

In a preferred embodiment, the testing technique is implemented on an ATE, which is advantageous because the ATE already comprises the desired masking capability (e.g., to enable flexible masking of output bits to be used in the signature analysis). As yet another example, embodiments of the present invention may be utilized with DUTs that have MISRs implemented on-chip, thus enabling a generic test platform. That is, while on-chip test circuitry (e.g., signature generation circuitry) is not required in embodiments of the present invention, certain embodiments of the present invention may be implemented on a platform (e.g., ATE) that may be used to also test DUTs that comprise on-chip test circuitry, thus enabling testing in the traditional techniques of the existing art or testing in accordance with embodiments of the present invention. That is, the platform of embodiments of the present invention does not preclude testing of a DUT that includes on-chip test circuitry (e.g., on-chip signature generation circuitry), but advantageously enables efficient testing of DUTs that do not include such on-chip test circuitry.

As still a further example, embodiments of the present invention may be implemented in combination with mask vector compression and/or input vector compression techniques for a test for further conservation of data storage required for implementing the test.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An off-chip test system comprising:
    means for inputting test data to a chip under test;
    means for receiving output data from said chip under test responsive to said input test data;
    means for generating a signature for at least a portion of said received output data, wherein said received output data is divided into a plurality of windows each comprising a predetermined number of bits and wherein said means for generating a signature generates a signature for each of said plurality of windows;
    means for comparing said generated signature with an expected signature; and
    means for storing information to an error map log if said generated signature fails to match with said expected signature.

2. The off-chip test system of claim 1 wherein said means for storing information does not require further interaction with said chip under test after determining that said generated signature fails to match said expected signature for acquiring said information to be stored to said error map log.

3. The off-chip test system of claim 1 wherein said means for comparing comprises:
    means for comparing said generated signature for a first window with an expected signature for said first window.

4. The off-chip test system of claim 3 wherein said means for storing information comprises:
    means for storing information to an error map log about at least said first window, if said generated signature for said first window fails to match with said expected signature for said first window.

5. The off-chip test system of claim 1 wherein said chip under test comprises circuitry on a semiconductor wafer, arid said off-chip test system is arranged external to said wafer.

6. The off-chip test system of claim 1 wherein said chip under test is a packaged chip, and said off-chip test system is arranged external to said packaged wafer.

7. The off-chip test system of claim 1 further comprising:
    means for masking at least a portion of said received output data from being used in generating said signature.

8. The off-chip test system of claim 1 further comprising:
    means for storing mask data identifying bits of said received output data to be masked, wherein said mask data is compressed.

9. The off-chip test system of claim 8 further comprising:
    means for decompressing said mask data.

10. The off-chip test system of claim 8 further comprising:
    means for compressing said mask data.

11. The off-chip test system of claim 1 wherein said means for storing information to said error map log stores said at least a portion of said received output data used for generating said signature that fails to match with said expected signature.

12. The system of claim 1 wherein the input test data comprises at least one input test pattern, and wherein the plurality of windows each comprises a predetermined number of output bits that are output responsive to a single input test pattern.

13. The system of claim 1 wherein the input test data comprises a plurality of different input test patterns, and wherein the plurality of windows each comprises a predetermined number of output bits that are output responsive to different input test patterns.

14. A system for testing circuitry, said system comprising:
    automated test equipment external to said circuitry that is at least temporarily communicatively coupled to said circuitry, wherein said automated test equipment comprises a communicative interface for inputting test data to said circuitry, a communicative interface for receiving output data from said circuitry responsive to said input test data, logic operable to determine a plurality of windows of the received output data, logic operable to generate a signature for each of the plurality of windows, compare logic for comparing a generated signature with an expected signature, and logic for storing information to an error map log if a generated signature fails to match an expected signature.

15. The system of claim 14 wherein said circuitry comprises circuitry on a semiconductor wafer.

16. The system of claim 14 wherein said logic for storing said information to an error map log does not require further interaction with said circuitry after detection of a generated signature failing to match an expected signature.

17. The system of claim 14 wherein said information stored to an error map log comprises said at least a portion of the received output data used for generating said signature that failed to match the expected signature.

18. The system of claim 14 wherein said automated test equipment further comprises:
logic for masking at least a portion of the received output data from being used is in generating the signature.

19. The system of claim 18 wherein said automated test equipment further comprises:
data storage communicatively coupled thereto that comprises mask data identifying bits of the received output data to be masked, wherein said mask data is compressed.

20. The system of claim 19 wherein said automated test equipment further comprises:
logic for decompressing the mask data.

21. The system of claim 14 further comprising:
logic for determining whether generated signatures fail to match expected signatures for a predetermined number of different windows, wherein said logic for storing information to an error map log performs said storing responsive to the determining logic determining that generated signatures fail to match expected signatures for the predetermined number of different windows.

22. A method for testing circuitry, said method comprising:
inputting test data to circuitry under test;
receiving, at an external test device, output data from said circuitry under test responsive to said input test data;
dividing said received output data into a plurality of windows, each window comprising a predetermined number of bits;
generating, at said external test device, a signature for each of said plurality of windows;
comparing, for each of the windows, said generated signature with an expected signature for the corresponding window to determine whether said circuitry under test functions as expected; and
if said generated signature fails to match with said expected signature, storing information to an error map log, wherein further interaction with said circuitry under test is not required after determining that said generated signature fails to match said expected signature for acquiring said information for storing said information to said error map log.

23. The method of claim 22 wherein said comparing step comprises:
comparing said generated signature for a first window with an expected signature for said first window.

24. The method of claim 23 wherein said storing information to an error map log further comprises:
if said generated signature for said first window fails to match with said expected signature for said first window, storing information about at least said first window to said error map log.

25. The method of claim 24 wherein said information about said first window comprises:
the received output data of said first window.

26. The method of claim 22 further comprising:
generating said expected signature for each of the windows, wherein said generating said expected signatures comprises
determining whether a first window of expected output bits is available for a given test, and
when determined that the expected output bits for the first window are available, inputting the expected output bits for the first window to signature generation logic, wherein the signature generation logic generates an expected signature for the first window based on the expected output bits for the first window.

27. The method of claim 22 further comprising:
receiving, at the external test device, input specifying the predetermined number of bits for at least one of the windows.

* * * * *